United States Patent [19]

Mack

[11] Patent Number: 5,240,046
[45] Date of Patent: Aug. 31, 1993

[54] FLUID FLOW CONTROL METHOD AND APPARATUS FOR MINIMIZING PARTICLE CONTAMINATION

[75] Inventor: Michael E. Mack, Manchester, Mass.

[73] Assignee: Eaton Corporation, Cleveland, Ohio

[21] Appl. No.: 913,731

[22] Filed: Jul. 15, 1992

Related U.S. Application Data

[60] Continuation of Ser. No. 727,828, Jul. 9, 1991, abandoned, which is a division of Ser. No. 585,914, May 21, 1990, Pat. No. 5,031,674, which is a division of Ser. No. 319,257, Mar. 3, 1989, Pat. No. 4,987,933.

[51] Int. Cl.[5] .................... G05D 16/00; F16K 24/04
[52] U.S. Cl. .................................... 141/8; 141/4; 137/14
[58] Field of Search .................... 141/4, 8, 37, 65, 66, 141/98; 137/14, 486, 487, 487.5; 250/441.1, 492.1, 492.2, 492.3; 414/217, 221

[56] References Cited

U.S. PATENT DOCUMENTS

| | | | |
|---|---|---|---|
| 3,963,043 | 6/1976 | Cota et al. | 137/487.5 |
| 4,172,477 | 10/1979 | Reich | 141/8 |
| 4,181,161 | 1/1980 | Kraus | 141/8 |
| 4,253,480 | 3/1981 | Kessel et al. | 137/487.5 X |
| 4,373,549 | 2/1983 | Nalepa et al. | 137/487.5 |
| 4,690,163 | 9/1987 | Steinemann | 137/14 X |
| 4,739,787 | 4/1988 | Stoltenberg | 137/14 |
| 4,836,233 | 6/1989 | Milgate, III | 137/14 |
| 4,936,340 | 6/1990 | Potter et al. | 137/487.5 |

Primary Examiner—Henry J. Recla
Assistant Examiner—Casey Jacyma
Attorney, Agent, or Firm—Watts, Hoffmann, Fisher & Heinke

[57] ABSTRACT

A fluid flow control for use with a process chamber. In the disclosed embodiment, the process chamber is for ion implantation of a workpiece and the fluid flow control is to assure the flow rates are maintained at values which are efficient in evacuating and pressurizing the chamber but are not high enough to dislodge particulate contaminants from the process chamber walls. In the disclosed design, the invention has utility both in instances in which wafers are directly inserted into the process chamber for ion implantation and in which the wafers are inserted into the chamber by use of a loadlock which avoids the requirement that the process chamber be cyclicly pressurized and depressurized.

4 Claims, 3 Drawing Sheets

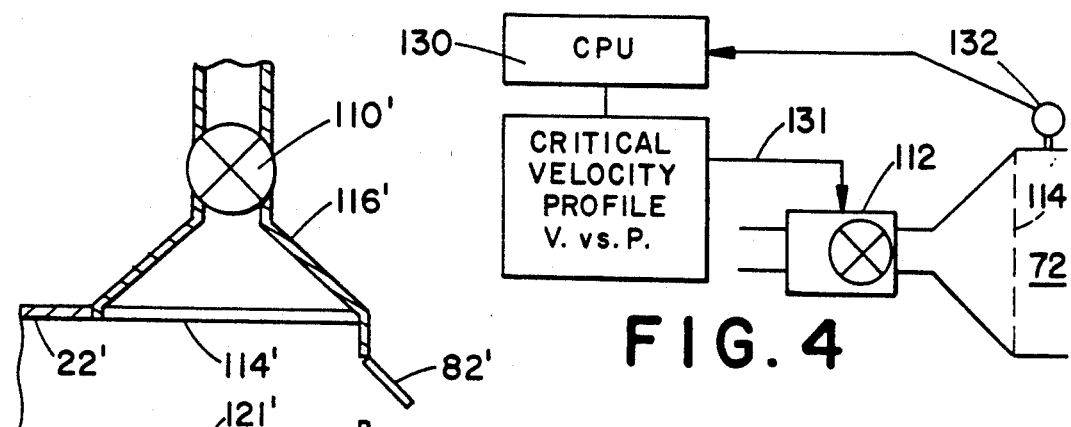
FIG. 3
FIG. 4
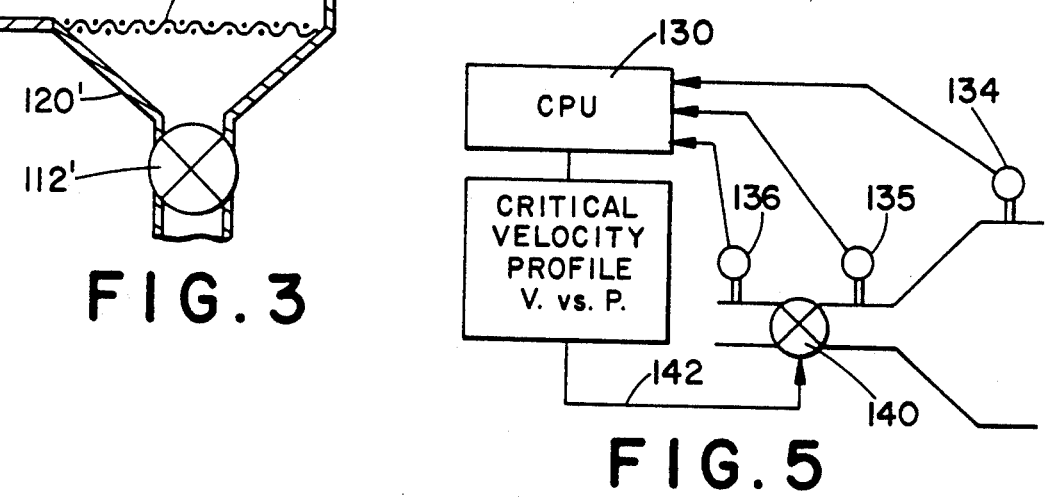
FIG. 5
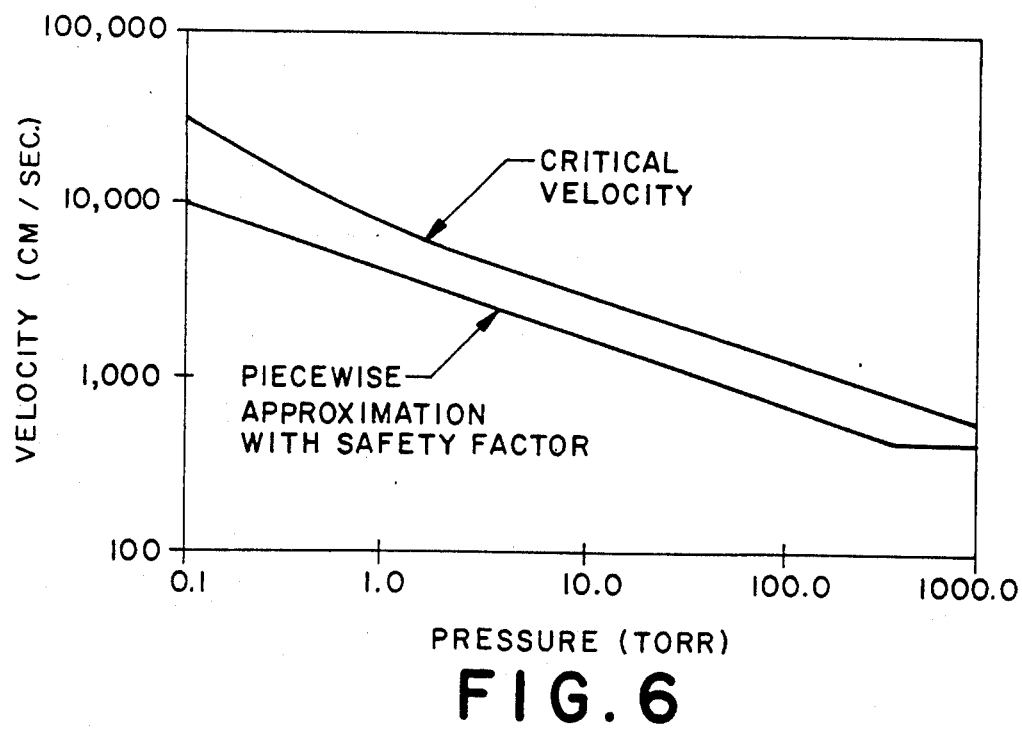
FIG. 6

FLUID FLOW CONTROL METHOD AND APPARATUS FOR MINIMIZING PARTICLE CONTAMINATION

This application is a continuation of application Ser. No. 07/727,828, filed Jul. 9, 1991, now abandoned, which is a division of copending application Ser. No. 07/585,914, filed on May 21, 1990, now U.S. Pat. No. 5,031,674, which is a division of application Ser. No. 07/319,257, filed on Mar. 3, 1989, now U.S. Pat. No. 4,987,933.

TECHNICAL FIELD

The present invention concerns method and apparatus for controlling the flow rates used in evacuating and repressurizing a process chamber in such a way as to minimize particle contamination on the workpiece.

Background Art

One example of a manufacturing process that requires controlled evacuation and repressurization of a work station is the process of controlled doping of semi-conductor wafers with ions in an ion implantation chamber. Ions from a source are accelerated along an ion travel path to impinge upon the wafers and introduce controlled doses of impurities into the silicon wafers. The ion travel path must be evacuated to assure the ions are well collimated. To accomplish this process in the prior art, wafers have been introduced to an ion implantation chamber, either through a load-lock or by introducing the wafers directly into the implantation chamber. If a load-lock arrangement is used, the load-lock chamber is successively evacuated and pressurized as wafers are inserted into the load-lock on their travel path to the ion implantation chamber. If no load-lock is used, the wafers are inserted directly into the ion implantation chamber which itself must be pressurized, evacuated, and then repressurized as the workpiece are inserted into the chamber, treated and then removed.

Other examples of processes involving pressurization and depressurization of a chamber are known in the prior art. In a sputter coating procedure, for example, a workpiece is inserted into a treatment chamber and then a coating is applied to the surface of the work piece by sputtering the coating material away from a target. This procedure can be used, for example, in coating magnetic material into a recording medium. Again, prior to conducting the coating process, the work piece must be inserted into the chamber and then the coating process conducted at a reduced pressure.

It is often a requirement in these processes that the level of contaminants within the processing chamber is kept at a minimum. If the contaminant level in a doping chamber, for example, exceeds a specified value, the semi-conductor yield of the process will be reduced.

Although steps are taken to reduce the level of particulate contamination within a processing chamber, these steps cannot totally avoid such contaminants. Particulates are inevitably introduced, for example, as the workpieces are inserted into an ion implantation chamber. These particulates tend to settle on the interior walls of the chamber and remain in place until air flow that occurs during chamber evacuation and repressurization dislodges the particles causing them to move within the chamber. If the particulate contaminants remain attached to the chamber walls, the work piece can be inserted into the chamber, treated, and removed without undue contamination. It is when the particles are dislodged and come to rest on the workpiece either before or after the ion implantation process that the particles' presence reduces production yield.

Prior are Stoltenberg U.S. Pat. No. 4,739,787 which issued Apr. 26, 1988 recognizes the possibility for contaminant presence affecting the yields during semi-conductor wafer fabrication. This patent recognizes the possibility of dislodging contaminants from chamber walls as air enters and exits the process chamber. As a proposed solution to the dislodging problem, the '787 patent recommends the use of "soft-start valves" which open in accordance with a controlled profile so tat "turn on" turbulence is reduced. Specifically, the '787 patent calls for a pressurization and depressurization of a chamber in accordance with a time profile.

While the '787 patent recognizes the importance of reducing detachment of particles from the chamber wall, this patent makes no mention of controlling flow velocity. Instead, the patent focuses on avoiding turbulence and accomplishes this by pressurizing and depressurizing the chamber in a timed sequence which avoids gas flow turbulence. The present invention concerns a type of pressure control for the pressurizing and depressurizing of a chamber to achieve appropriate pressures in an efficient manner without dislodging undue amounts of contaminants from the chamber wall.

DISCLOSURE OF THE INVENTION

The present invention concerns method and apparatus for evacuating a process chamber and then repressurizing it by pumping air from the chamber and then allowing air to re-enter the chamber. The process controls the flow rates of the air as it enters and exits the chamber to minimize dislodging of particular contamination from the chamber walls.

A system for treating one or more workpieces constructed in accordance with the invention includes a chamber having a chamber interior into which the one or more workpiece are moved during the treatment process. The chamber has one or more workpiece openings for inserting those workpiece into the chamber and removing the workpiece after they have been treated. The chamber also includes one or more openings for allowing air to enter the chamber through an inlet passageway and evacuating the chamber by withdrawing air in the chamber through a second outlet passageway. A pressure sensor monitors pressure inside the chamber and provides a pressure signal indicative of the sensed pressure. A programmable controller monitors the pressure signal and adjusts the air flow rates of air entering or exiting the chamber to avoid contamination of the chamber interior caused by too high a flow rate of the air as it moves into and out of the chamber.

A preferred application of the system is for ion implantation of silicon wafers. In this application, the chamber having the openings for inserting the workpiece can either be the process chamber itself in which the workpiece is positioned during ion implantation, or alternately, the chamber is a load-lock into which the workpiece is inserted. In this latter application, the workpiece is inserted into the load-lock, the load lock is then depressurized and then the workpiece is again transferred from the load-lock into a process chamber.

In either application, the flow controller monitors pressure within the chamber and adjusts flow rate of air entering and exiting the chamber to avoid particulate contamination of the chamber. This is most preferably accomplished with a pressure sensor and a flow control valve which can be adjusted based upon the sensed pressure within the chamber to provide a specific air flow rate. The correlation between chamber pressure and flow rate is most preferably accomplished with a programmable controller having a look-up table for comparing the sensed pressure within the chamber with a maximum flow rate and outputting a signal to adjust a flow control valve setting to achieve the requisite flow rate. In the preferred design, a safety factor is built into the look-up table of the programmable controller so that a flow rate is produced which should dislodge even fewer particles than an amount deemed acceptable.

In an alternate arrangement, the flow rate of air entering and exiting the chamber can be monitored with multiple pressure sensors and the setting of an adjustable valve changed in response to the multiple pressure readings from the pressure sensors to provide a desired air flow rate. This technique utilizes more pressure sensors in different locations but can be implemented with a less expensive valve arrangement.

From the above it is appreciated that one object of the invention is a new and improved flow control mechanism for use in a process control that involves successively evacuating and repressurizing a process chamber. The particular technique disclosed focuses on the actual flow rates rather than the time period in which the depressurization and repressurization is accomplished. This and other objects, advantages and features of the invention will become better understood from the following detailed description of a preferred embodiment of the invention which is described in conjunction with the accompanying drawings.

BRIEF DESCRIPTION OF THE DRAWINGS

FIG. 3 depicts an alternate arrangement in which the ion implantation chamber itself is evacuated and then repressurized as wafers are treated and then withdrawn from the ion implantation chamber;

FIG. 4 is a schematic showing one process control technique for controlling the flow rates of air passing through a passageway in fluid communication with a chamber;

FIG. 5 is a schematic of an alternate arrangement to the FIG. 4 schematic showing a different process for controlling flow rates in an air flow passageway;

FIG. 6 is a graph depicting a look-up mechanism for correlating sensed pressure with maximum allowable velocity of air entering the chamber to avoid undue particle contamination of the chamber.

BEST MODE FOR CARRYING OUT THE INVENTION

Figure 1:
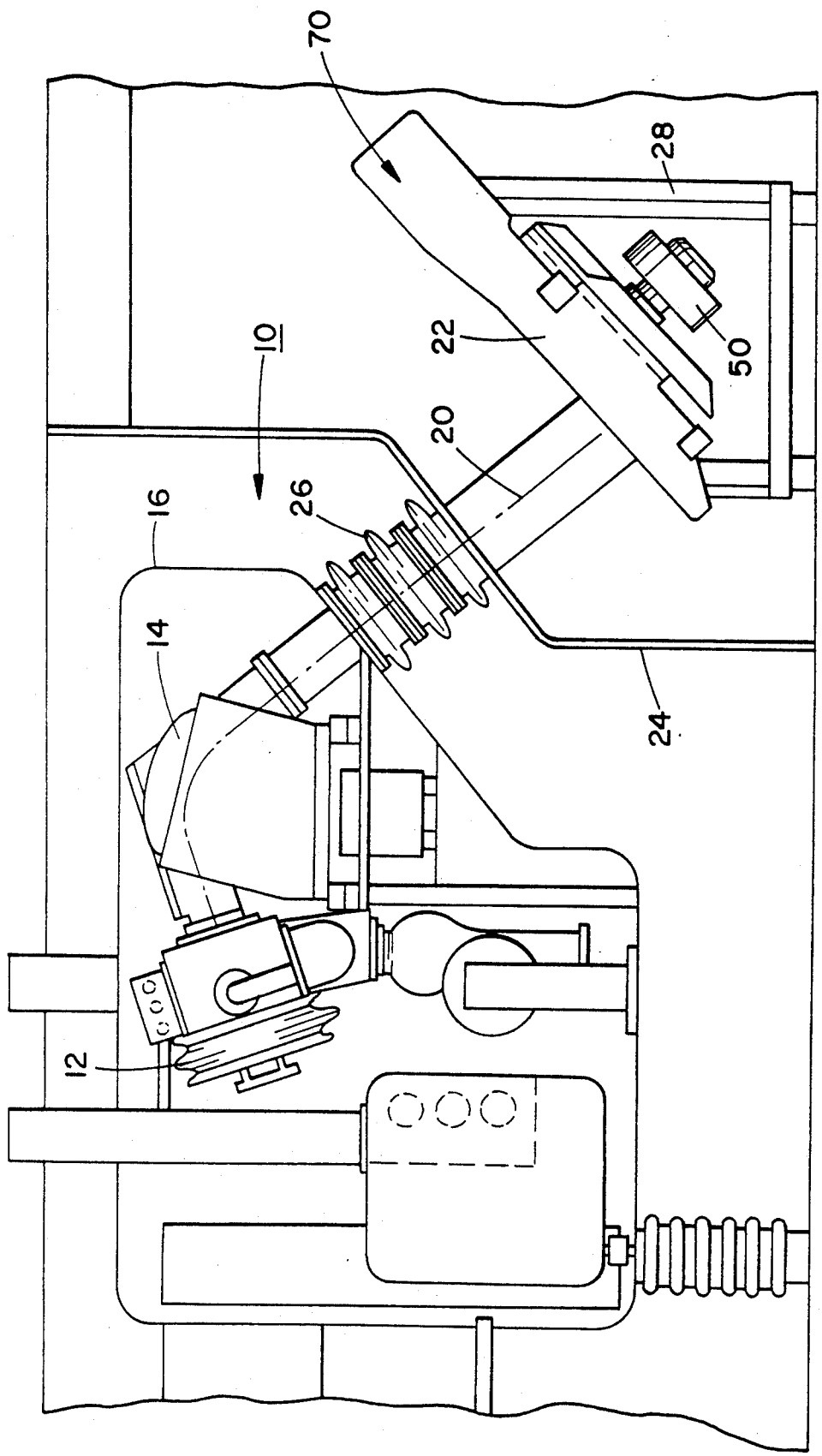
FIG. 1 is a schematic description of an ion implantation system.

Turning now the drawings, FIG. 1 depicts an ion implantation system 10 having an ion source 12 and an analyzing magnet 14 contained within a first housing 16. An ion beam 20 from the source 12 is directed along a travel path which causes it to exit the housing 16 and travel to an ion implantation chamber 22 positioned inside a second housing 24. The analyzing magnet 14 resolves the ions within the beam 20 to produce a well defined beam of a chosen ion species that exits the housing 16 and passes through a coupling conduit 26 to enter the second housing 24.

Figure 2:
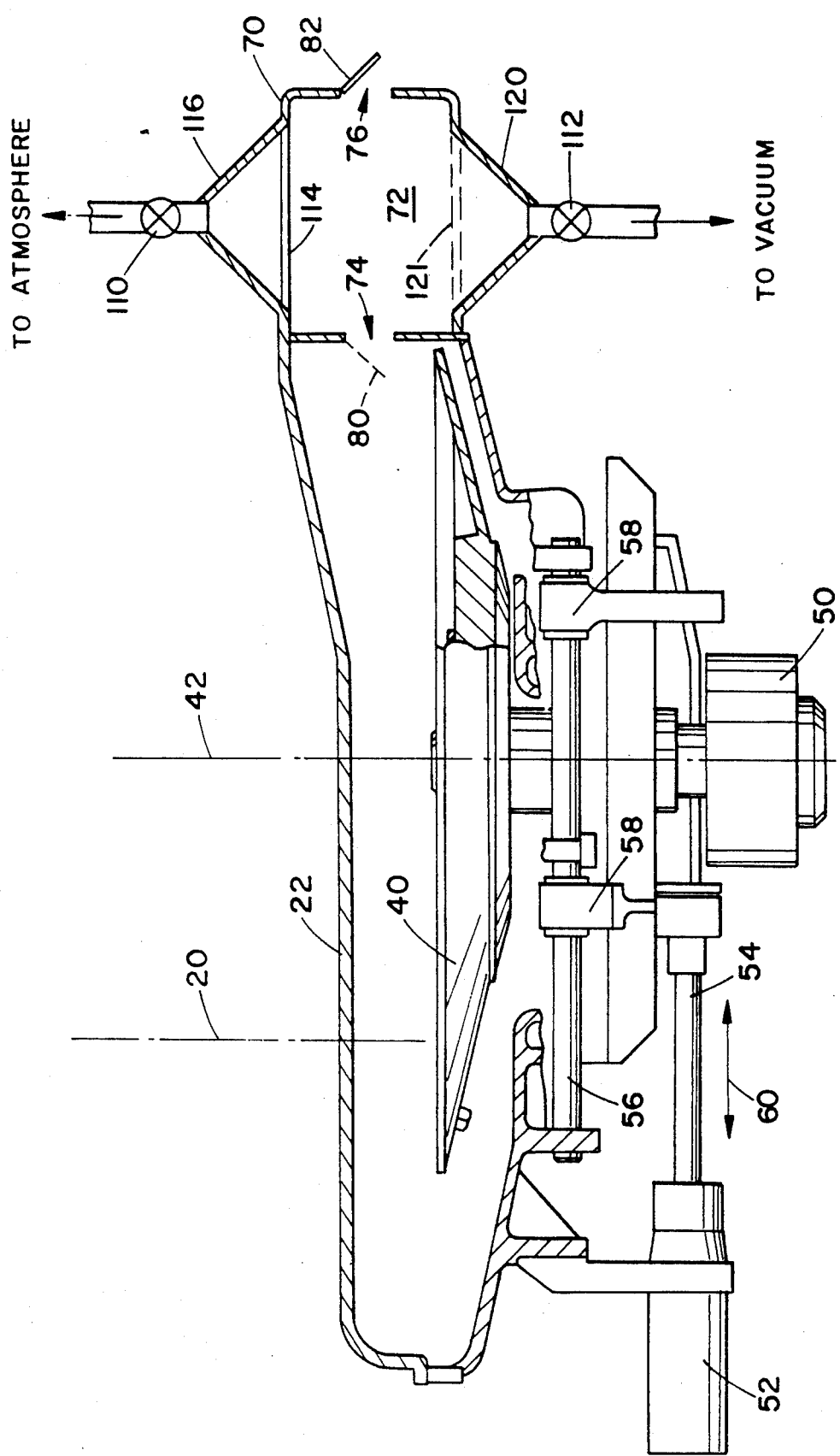
FIG. 2 is an enlarged elevation schematic showing an ion implantation chamber and load-lock for inserting and withdrawing silicon wafers from the implantation chamber.

The ion implantation chamber 22 is supported on a moveable pedestal 28 which facilitates alignment of the chamber 22 in relation to the ion beam 20. As seen most clearly in FIG. 2, the ion beam 20 enters the implantation chamber 22 and impinges upon a wafer support 40 that moves individual silicon wafers along a circular path designed to cause the ion beam 20 to impact the wafers and selectively dope those wafers with in impurities. The support 40 is mounted for rotation about an axis 42 and high speed rotation of the support 40 is accomplished by a motor 40 which rotates the support 40 once wafers have been mounted about an outer periphery of the support 40.

The wafer support 40 is mounted for translational movement within the chamber 30 to shift the wafer position back and forth in a scanning motion that accomplishes a controlled doping of the ion impurities. This back and forth translational movement is accomplished by a second motor 52 coupled to the support 40 by a drive shaft 54. The motor 50 and wafer support 40 are supported by a guide rail 56. Two bearings 58 support the wafer support 40 and motor 40 for sliding movement as indicated by the arrow 60 in FIG. 2. During ion implantation of the silicon wafers, the support 40 rotates at high speed while moving back and forth as indicated by the arrow 60 to assure a controlled concentration of doping impurities impact the wafers mounted about the periphery of the support 40.

Semiconductor wafers are inserted into the ion implantation chamber 22 through a load-lock 70. the load-lock 70 defines a chamber 72 that is evacuated by a vacuum pump (not shown) to the same pressure as the pressure inside the ion implantation chamber 22 to allow wavers to be transferred back and forth through an opening 74 between the load-lock and the chamber 22.

Automatic mechanisms for moving the wafers into and out of the chamber 22 are known in the prior art. These same mechanisms insert the wafers into the load-lock 70 via a second opening 76. The wafers are initially inserted into the load-lock 70 and the pressure within the load-lock reduced until the pressure inside the load-lock chamber 72 is the same as the pressure inside the ion implantation chamber 22. A fluid tight door or hatch 80 is then opened to allow the wafers inside the load-lock to be transferred into the ion implantation chamber. Once the ion implantation process is completed, the wafers are moved from the chamber 22 back into the load-lock 70 and the load-lock is repressurized by allowing air to flow back into the chamber 72. A second door or hatch 82 is opened and the treated wafers are withdrawn through the opening 76 and moved to subsequent wafer handling and processing stations.

It is while the load-lock 70 is being evacuated and repressurized that there is a danger of dislodging particulate contaminants from the wall of the load-lock chamber 72. The flow rates of air entering and exiting the chamber 72 are carefully monitored in accordance with the present invention. Acceptable flow rates are derived from theoretical considerations of the forces the particulates clinging to the chamber walls must experience before they are dislodged from those walls.

Theoretical Flow Rate Limit Calculation

The aerodynamic force acting on a particle due to a fluid flow is $$F_{aero} = \tfrac{1}{2}(C_d/C_c)pu^2 A_p \quad \text{(Equation 1)}$$

where $C_d$ is the drag coefficient, $C_c$ is the Cunningham slip factor, p is the gas density, u is the local gas velocity at the particle and $A_p$ is the cross sectional area of the particle. All of these factors depend solely on gas density (and therefore, pressure), local gas velocity and particle size. The particles of concern are attached to the walls of the load-lock chamber. The flow velocity at the wall is u=0 because of the existence of what is referred to as the boundary layer. The velocity profile moving away from the wall and into the flow depends on the type of flow. The velocity gradient is more gradual in a laminar flow than in a turbulent flow. Equivalently, if one moves a small distance from the wall in a laminar flow, the velocity will be a much small fraction of the free stream velocity than in the case of a turbulent flow. Of course, the free stream velocity in the turbulent flow may be greater. For a laminar flow the velocity a distance y from the wall will be $$v/u^* = 3/2(y/\delta) - \tfrac{1}{2}(y/\delta)^2 \quad \text{(Equation 2)}$$

where $u^*$ is the free stream velocity and $\delta$ is the boundary layer thickness. Typically, $\delta$ is the order of millimeters for the pressures and flow velocities of interest here and decreases as $(u^*)^{-1/8}$. Combining with y=d, the particle diameter, gives $$F_{aero} = G(d/P)p^{\frac{1}{2}}(u^*)^{3/2} \quad \text{(Equation 3)}$$

Here G(d,)) is weakly dependent on pressure.

In order for a particle to detach from the walls the aerodynamic force must at least large enough to slide the particle along the surface. If the friction coefficient is k and the attachment force is $F_{attach}$, then to detach a particle from the chamber walls $$F_{aero} > k \, F_{attach} \quad \text{(Equation 4)}$$

This attachment force will be independent of gas conditions. Thus, to detach particles $$(u^*)^{3/2} \sim k \, F_{attach}/G(d,P)P^{\frac{1}{2}} \quad \text{(Equation 5)}$$

Experiments have confirmed the correctness of this result. The attachment force depends on a variety of particle parameters as well as on the properties of the wall. The same experiments have shown that $kF_{attach}$ is on the order of $5 \times 10^{-6}$ dynes or greater. This is the only unknown in the above equation and allows the determination of the critical velocity, $u^*_{crit}(P)$, such that particles will be detached at greater velocities and not detached at lower velocities. $u^*_{crit}(P)/m$, where m is the safety factor, is the optimum venting profile for air entering the load-lock or for air leaving during depressurization. Note that the critical velocity depends only on ambient pressure.

Returning to FIG. 2, as the load-lock 70 is pressurized a flow controller 110 is opened to allow air to enter the interior of the chamber 72 at a controlled flow rate. On an outlet side of the load-lock 70, a second flow controller 112 i opened to allow air inside the load-lock 70 to be pumped out of the chamber 72.

On air inlet side the load-lock 70 includes a flow diffuser 114 which achieves a uniform flow of gas across the area of the diffuser. The diffuser 114 should be as large as practical compared to the chamber dimensions. In the disclosed embodiment, for example, the diffuser 114 defines essentially one entire boundary wall for the load-lock chamber 72. A flow passageway between the controller 110 and diffuser 114 defines a tapered section 116 of increasing area.

On an outlet side of the load-lock 70, a second tapered passageway 120 provides a transition between the relatively low flow rates inside the load-lock and the higher air flow rates in a passageway 122 leading to the vacuum pump. Air velocity control is less critical on the outlet side and a diffuser may not be necessary. If contamination exceeds acceptable limits, however, a second diffuser 121 shown in phantom in FIG. 2 can be utilized.

The two flow control units 110, 112 are adjusted by a programmed controller 130 (see FIG. 4). As air enters the chamber 72 the programmed controller 130 monitors an input from a pressure sensor 132 that monitors air pressure inside the load-lock 70. The theoretical discussion above concerning the acceptable flow rates to avoid detachment of the particles from the chamber walls is programmed into the programmable controller 130 in the form of a look-up table. The pressure monitored by the sensor 132 is correlated to a maximum flow rate as indicated in the graph (FIG. 6) schematically depicting the theoretical considerations. This allows the controller 130 to calculate a critical velocity profile as the pressure within the load-lock changes.

The two flow control units may be a mass flow control unit commercially available from many companies including, for example, Sierra Instruments. The flow rate through a suitable flow control unit is computed in terms of volume of fluid per unit time, i.e. cubic feet per second or the like. If the flow rate through the controller 100, for example, is controlled, the velocity of air entering the chamber 72 past the diffuser 114 can be calculated by dividing this flow rate F by the cross-sectional area A of the diffuser, v=F/A. It is straight-forward for the controller 130 to correlate the measured pressure to a desired flow rate based upon the maximum permitted velocity of the air in the region of the diffuser 114 (see FIG. 6). A signal at an output 131 from the controller 130 adjusts the flow of air through the flow control 110 to achieve an appropriate velocity V that avoid particle detachment.

The size of the chamber 72 and the flow rates needed to efficiently transfer wafers require relatively large mass flow control units which can be expensive to utilize. In addition for depressurization commercial mass flow controllers are limited in conductance. An alternate control scheme utilizes multiple pressure sensors 134–136 (FIG. 5) instead of the single pressure sensor 132. In this alternate embodiment, if the pressures on opposite sides of a valve 140 are measured, the valve setting can be adjusted based upon the measured pressures. The flow rate of air passing through the valve 140 is equal to a constant Q, dependent upon the particular valve multiplied by the difference in pressure at the two sensors 135, 136. In equation form $$F(flow)=Q(P_1-P_2) \quad \text{(Equation 6)}$$

In the FIG. 5 embodiment the controller 130 adjusts the setting of the valve 140 by a control signal at an output 142 that opens and closes the valve 140 depending on whether the gas velocity (v=F/A) is above or below a target gas velocity at the diffuser 114. Implementations other other than FIGS. 4 and 5 will be apparent to those skilled in the art of flow control. The important feature of the invention is the control of entering and exiting flow velocity as a function of chamber pressure.

Practice of the invention is not limited to situations in which a load-lock 70 is utilized. In FIG. 3, for example, the ion implantation chamber 22' is pressurized and evacuated directly so that air is allowed to enter the chamber 22' before wafers are either inserted into or taken out of the chamber 22' through the hatch 82'. The door or hatch 82' is then closed and the chamber 22' is evacuated. The flow control rates of both pressurization and depressurization are monitored and adjusted using flow control units 110', 112' in a manner similar to the techniques discussed above in regard to FIG. 4 or FIG. 5. Various mechanisms for inserting wafers directly into an ion implantation chamber such as the chamber 22' of FIG. 3 are known within the prior art. These insertion and withdrawal techniques, however, are consistent with the monitoring of air flow as it is pumped from the chamber and allowed to enter the chamber during repressurization.

The present invention has been described with a degree of particularity. It is the intent, however, that the invention include all modifications and alterations from the disclosed design within the spirit or scope of the appended claims.

I claim:

1. A method for alternatively evacuating and pressurizing a process chamber while avoiding chamber contamination by dislodging particle contaminants comprising the steps of:
   a) defining a critical maximum air flow velocity which depends on sensed pressure and which minimizes the dislodging of particle contaminants and which decreases with increasing air pressure;
   b) sensing pressure inside the chamber and determining an instantaneous air flow rate based upon the geometry of the chamber; and
   c) adjusting the flow rate of air entering or exiting the chamber as the determined instantaneous air flow rate changes during pressurization or evacuation to produce a velocity of air movement within the chamber below the critical maximum velocity.

2. The method of claim 1 wherein the adjusting step is performed by setting a fluid flow controller to regulate the volume of air entering the chamber per unit time.

3. The method of claim 1 wherein the adjusting step is accomplished by measuring a pressure difference across a valve and changing the valve setting to produce a desired pressure difference corresponding to an appropriate air flow rate entering or exiting the chamber.

4. The method of claim 1 including the additional steps of inserting a semiconductor wafer int he chamber and impinging the wafer with ions from an ion source while the chamber is evacuated.

* * * * *